United States Patent
Tanaka

(10) Patent No.: US 7,006,225 B2
(45) Date of Patent: Feb. 28, 2006

(54) ALIGNMENT MARK, ALIGNMENT APPARATUS AND METHOD, EXPOSURE APPARATUS, AND DEVICE MANUFACTURING METHOD

(75) Inventor: Hiroshi Tanaka, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 492 days.

(21) Appl. No.: 10/241,534

(22) Filed: Sep. 12, 2002

(65) Prior Publication Data

US 2003/0053058 A1    Mar. 20, 2003

(30) Foreign Application Priority Data

Sep. 17, 2001    (JP)    ............................. 2001-282101

(51) Int. Cl.
  *G01B 11/00*    (2006.01)
(52) U.S. Cl. .................................... 356/401
(58) Field of Classification Search ........ 356/399–401; 438/401; 257/702
  See application file for complete search history.

(56) References Cited

U.S. PATENT DOCUMENTS

| | | | | |
|---|---|---|---|---|
| 5,050,111 A | * | 9/1991 | Ayata et al. ................. 356/400 |
| 5,204,739 A | * | 4/1993 | Domenicali .................. 348/79 |
| 5,249,016 A | | 9/1993 | Tanaka ........................ 355/53 |
| 5,456,404 A | * | 10/1995 | Robinette et al. ........... 228/104 |
| 5,648,854 A | * | 7/1997 | McCoy et al. ............... 356/401 |
| 5,774,575 A | | 6/1998 | Tanaka et al. ............... 382/149 |
| 5,815,594 A | | 9/1998 | Tanaka ........................ 382/151 |
| 6,870,623 B1 | * | 3/2005 | Tanaka et al. ............... 356/401 |
| 2004/0021866 A1 | * | 2/2004 | Watts et al. ................. 356/401 |

* cited by examiner

*Primary Examiner*—Samuel A. Turner
*Assistant Examiner*—Gordon J. Stock, Jr.
(74) *Attorney, Agent, or Firm*—Fitzpatrick, Cella, Harper & Scinto

(57) ABSTRACT

An alignment mark includes a first mark usable for global alignment measurement in the direction of a scribe line, and a second mark usable for pre-alignment measurement in a direction perpendicular to the direction of the scribe line. The first mark is formed by arranging a plurality of strip-shaped X measurement marks whose longitudinal direction is perpendicular to the direction of the scribe line. In the second mark, the strip-shaped second measurement marks are arranged at the two ends of the first mark such that the longitudinal direction of the second measurement mark is perpendicular to that of the first measurement mark. The alignment mark can be shared by global alignment and pre-alignment, and applied to a narrow scribe line.

14 Claims, 16 Drawing Sheets

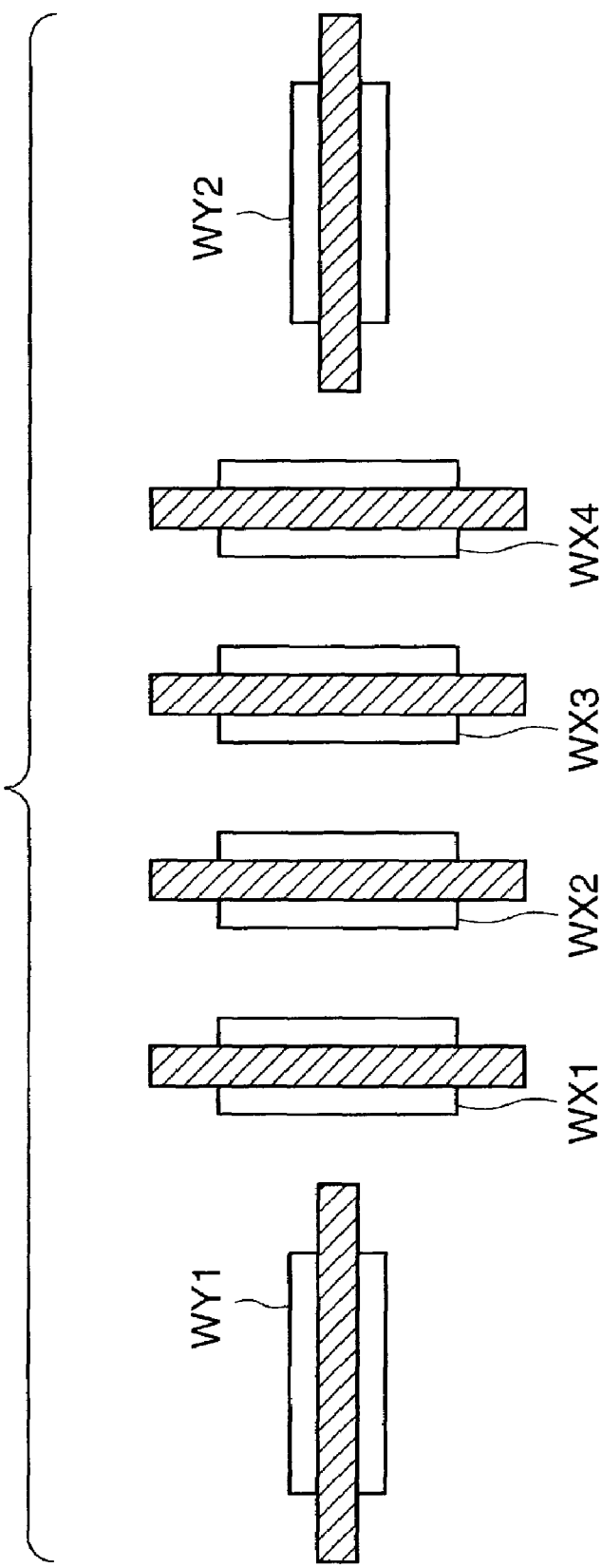

FIG. 4A
FIG. 4B
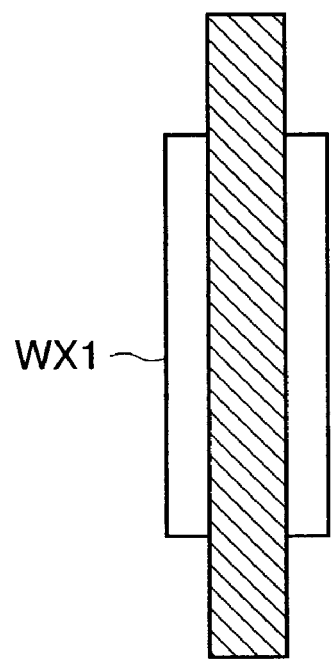
WX1
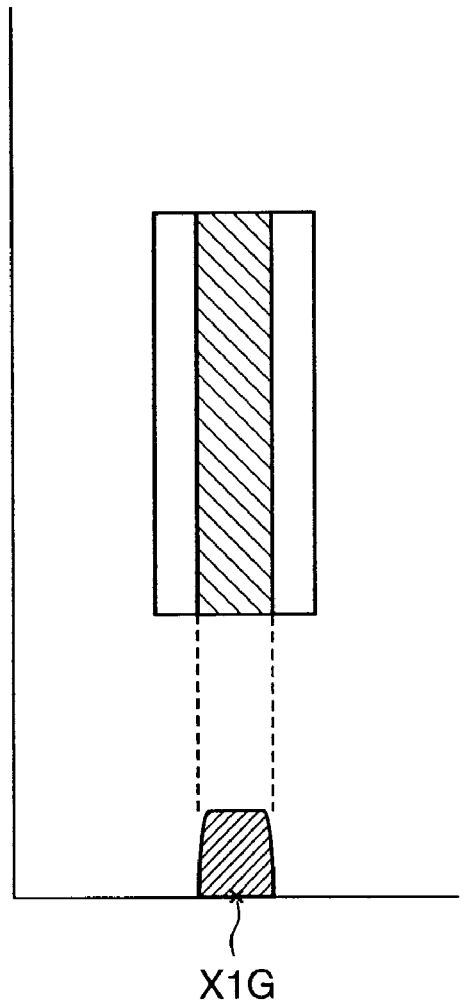
X1G

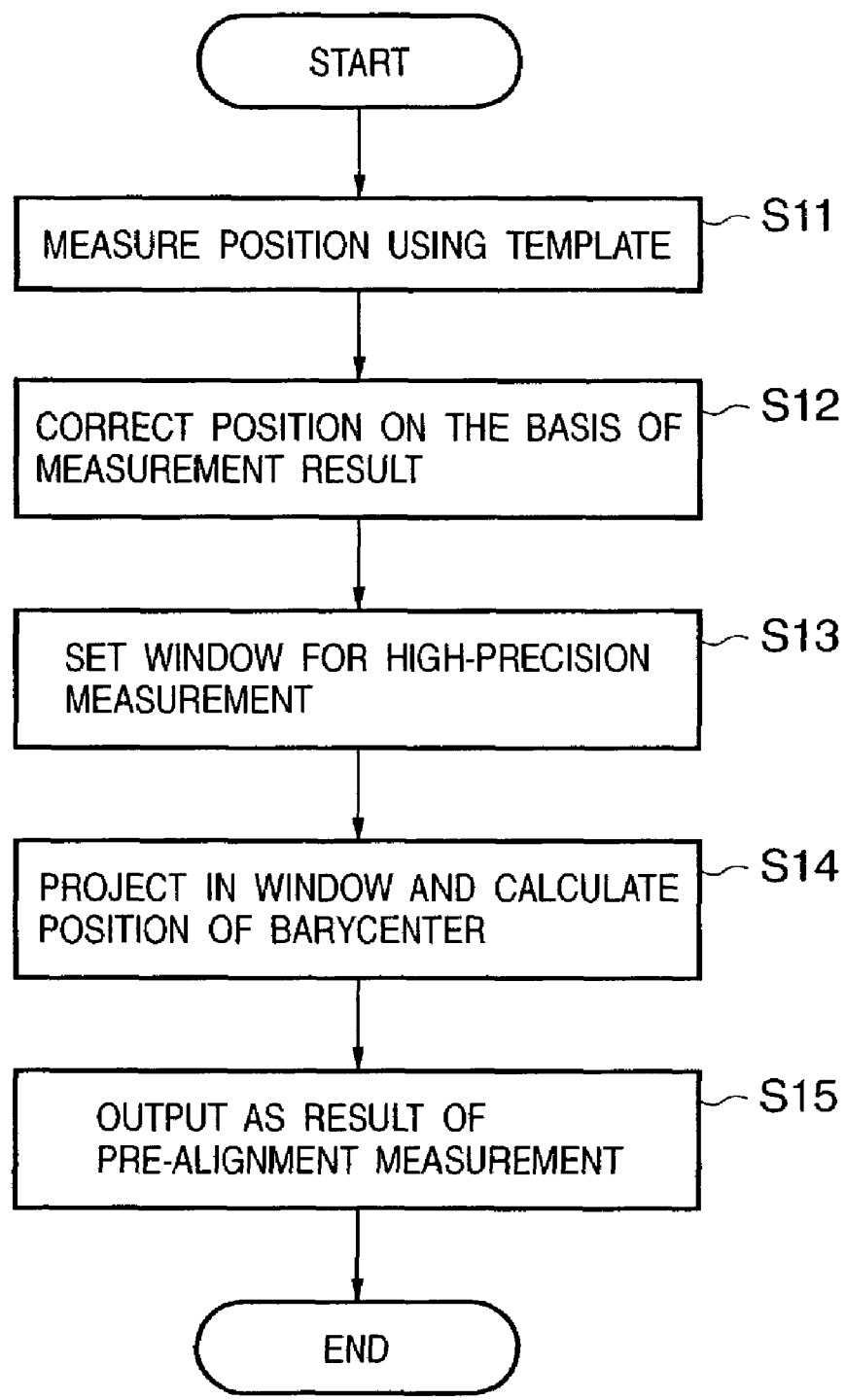

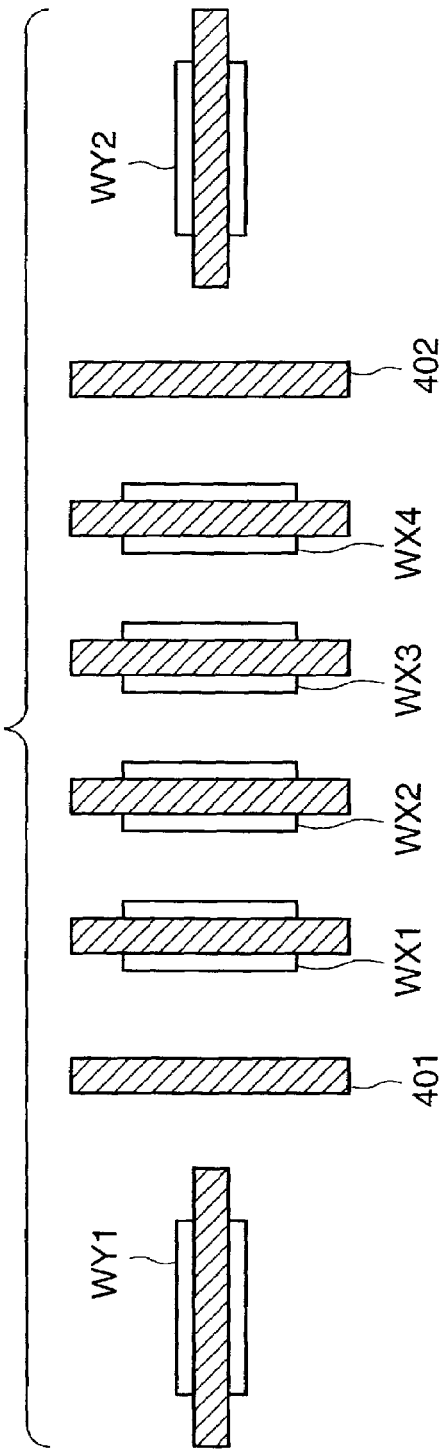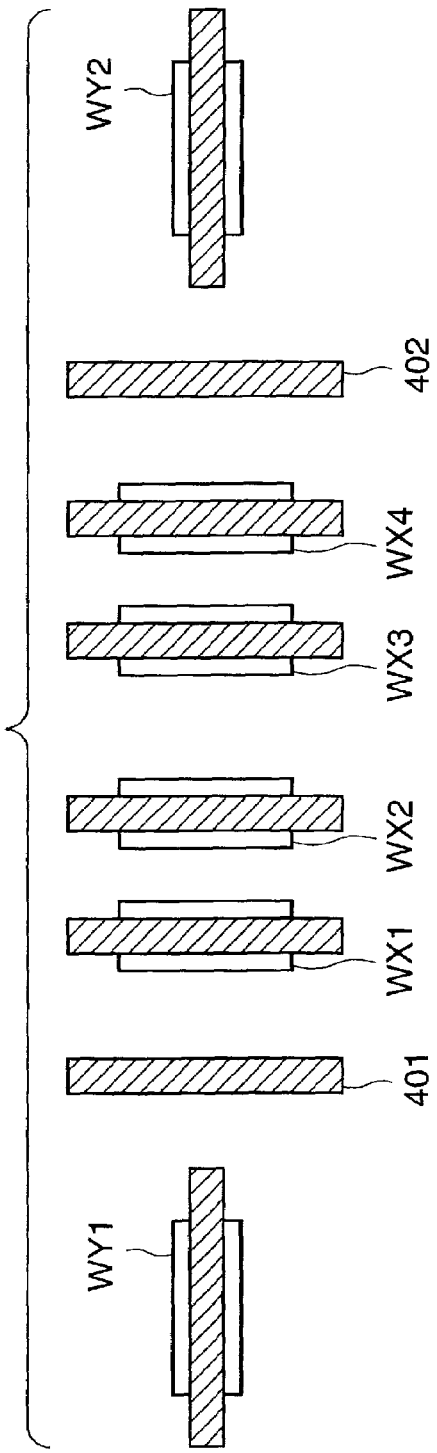

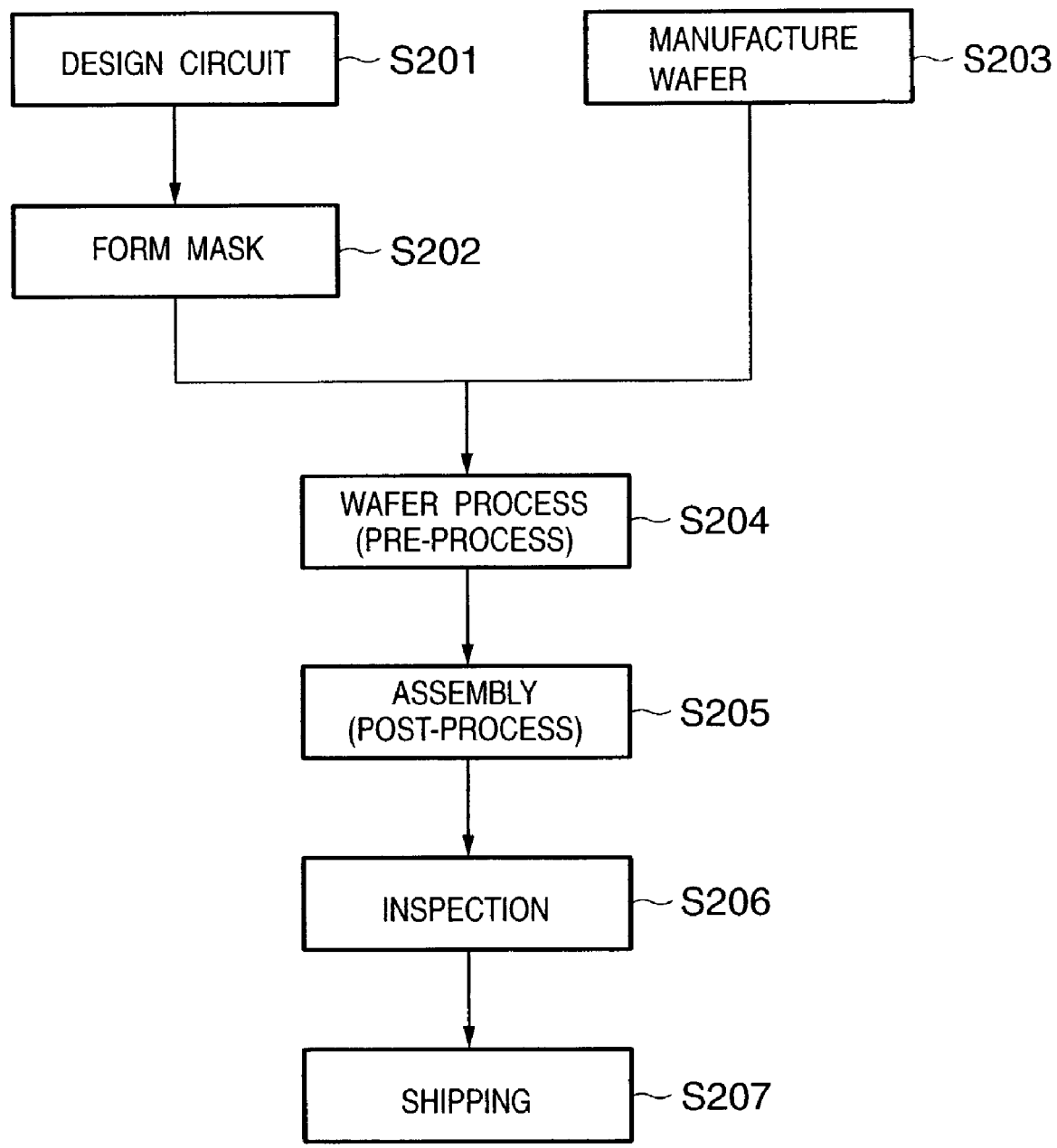

ALIGNMENT MARK, ALIGNMENT APPARATUS AND METHOD, EXPOSURE APPARATUS, AND DEVICE MANUFACTURING METHOD

FIELD OF THE INVENTION

The present invention relates to alignment marks and a substrate with the alignment marks, a positioning apparatus and method, an exposure apparatus using the positioning apparatus, and a device manufacturing method, provided in exposure processing and the like performed by a semiconductor exposure apparatus.

BACKGROUND OF THE INVENTION

Wafer alignment in a general semiconductor manufacturing apparatus will be described with reference to FIGS. 11, 12, and 13. If a wafer W is supplied to the semiconductor manufacturing apparatus, first, mechanical pre-alignment is performed in step S01. A mechanical alignment apparatus MA mechanically aligns the wafer W by using the periphery of the wafer W and an orientation flat or notch (notch N is shown in FIG. 12) formed on the periphery of the wafer to determine the rough position of the wafer W. The mechanical alignment precision is about 20 $\mu$m.

In step S02, the wafer W is set on a chuck CH and supplied to a stage STG by a wafer supply apparatus (not shown), and pre-aligned in step S03. In pre-alignment, a mirror MM is inserted into an optical path in a scope SC (the mirror MM moves to the right in FIG. 13). Light from an alignment mark illumination light source Li is detected by a sensor S1 set to a low magnification. Left and right pre-alignment marks (PAL and PAR) shown in FIG. 12 are detected using the low-magnification sensor S1, and their mark positions are obtained to attain the center of the wafer. The alignment precision in this pre-alignment is about 4 $\mu$m.

Then, global alignment is performed to accurately obtain the position of the wafer W and the position of an exposure shot in step S04. In global alignment, the mirror MM is removed from the optical path (the mirror MM moves to the left in FIG. 13). A sensor S2 set to a high magnification is used to measure the positions of a plurality of global alignment marks (FX1 to FX4 and FY1 to FY4) on the wafer W shown in FIG. 12. In this manner, X- and Y-direction shifts of the wafer W, the rotational component, and the magnification component of the shot array are obtained. The global alignment precision must be 50 nm or less in a machine which manufactures current 256-Mbit memories. After global alignment ends, exposure starts in step S05.

As described above, accurately obtaining the wafer position requires at least pre-alignment and global alignment on the chuck CH. Furthermore, since pre-alignment and global alignment have different detection targets, two kinds of marks are required.

In pre-alignment, the mark must be detected in a wide field of view after mechanical rough alignment. The mark must be detected by a low-magnification scope and must be as large as about 100 $\mu$m. In global alignment, the mark is precisely detected by a high-magnification scope because the mark has already been aligned with a shift of about 4 $\mu$m by pre-alignment. Hence, the marks are small.

In recent semiconductor fabrication, the wafer processing called CMP (Chemical Mechanical Polish) is mainly performed. An alignment mark on a wafer having undergone the CMP must be accurately measured. Hence, the shape and line width of the alignment mark must be tuned in accordance with the processing. Both the pre-alignment mark and global alignment mark must be respectively tuned. Tuning of the two kinds of marks requires a long time, and decreases the yield.

Recently, in order to minimize the manufacturing cost of the semiconductor, a scribe line in which the alignment mark and the like can be arranged is narrowed. In some cases, a scribe line with a width equal to or smaller than the size of the pre-alignment mark is required.

Additionally, in the step of forming a bonding pad, since the steps of a scribe line become large, the size of the alignment mark is further strictly limited. FIGS. 14A to 14D show the scribe line, a pre-alignment mark PA, and a global alignment mark F. Reference numerals s11 and s12 in FIG. 14A denote edges of the scribe line, and an interval between the edges is the width of the scribe line. When the steps of the scribe line are small as shown in FIG. 14B, no problem arises in the relationship between the width of the scribe line and the size of the alignment marks shown in FIG. 14A.

However, in the step of forming the bonding pad, the steps of the scribe line become large, and a resist is applied to these large steps. Hence, unobservable areas are increased, and the areas in which the pre-alignment marks can be accurately observed are further narrowed. Hence, the pre-alignment marks of 100 $\mu$m are difficult to detect. FIGS. 14C and 14D show this state. When the steps of the edge portions s11 and s12 become large and a resist R is applied to the steps, the resist thickness sharply changes at the edge portions. When the change portions are observed with a scope SC shown in FIG. 13, the intensity of scattered light on the resist change portions is increased, and the areas of DA1 and DA2 in FIG. 14C cannot be observed by dark field illumination. As a consequence, the edges of the pre-alignment mark PA cannot be observed. When bright field illumination is used, light in the resist change portions is also scattered and the intensity of reflected light is decreased. Therefore, in an image observed by the scope SC, the areas DA1 and DA2 shown in FIG. 14C cannot be observed, and thus the edges of the pre-alignment mark PA become black and cannot be observed.

While the detection of the marks becomes difficult, demands are arising for short-time detection and measurement. Since the number of wafers processed per unit time must be increased, the time of processing called alignment not accompanied by exposure must be shortened as much as possible.

As described above, in general alignment, the following problems arise.

(1) Two kinds of marks are required for wafer alignment.
(2) Since the scribe line becomes narrow, or the observable area becomes narrow, a large pre-alignment mark cannot be arranged in the scribe line.
(3) Alignment processing time is required to be shortened.

SUMMARY OF THE INVENTION

The present invention has been made in consideration of the above situation, and has as its object to provide alignment marks which can be shared by global alignment and pre-alignment and applied to a narrow scribe line, an alignment apparatus which uses the alignment marks, a method thereof, and the like.

It is another object of the present invention to provide an alignment apparatus which is effective in performing alignment using the alignment marks which can be shared by global alignment and pre-alignment, and can reduce the alignment processing time, a method thereof, and the like.

According to the present invention, the foregoing object is attained by providing an alignment mark, comprising a first mark usable for global alignment measurement in a first direction, and a second mark usable for pre-alignment measurement in a second direction.

According to the present invention, the foregoing object is attained by providing an alignment apparatus which positions a substrate having an alignment mark which includes a first mark usable for global alignment measurement in a first direction, and a second mark usable for pre-alignment measurement in a second direction, comprising first measurement means for performing pre-alignment measurement in the first and second directions of the alignment mark by using the first mark and the second mark, moving means for moving to correct a position of the substrate on the basis of a result of the pre-alignment measurement, and second measurement means for performing global alignment measurement by the first mark in the first direction of the alignment mark by using the first mark after moving the substrate.

According to the present invention, the foregoing object is attained by providing an alignment apparatus which positions a substrate having an alignment mark which include a first mark usable for global alignment measurement in a first direction, and a second mark usable for pre-alignment measurement in a second direction, comprising first measurement means for performing pre-alignment measurement in the first and second directions of the alignment mark by using the first mark and the second mark, moving means for moving to correct a position of the substrate on the basis of a result of the pre-alignment measurement, and second measurement means for performing global alignment measurement by the first mark in the first direction of the alignment mark by using the first mark after moving the substrate.

According to the present invention, the foregoing object is attained by providing an alignment method of positioning a substrate having an alignment mark including a first mark usable for global alignment measurement in a first direction and a second mark usable for pre-alignment measurement in a second direction, comprising the first measurement step of performing the pre-alignment measurement in the first and second directions of the alignment mark by using the first and second marks, the moving step of moving the substrate to correct the position on the basis of a result of the pre-alignment measurement, and the second measurement step of performing the global alignment measurement in the first direction of the alignment mark by using the first mark after the moving step.

According to the present invention, the foregoing object is attained by providing an alignment method of positioning a substrate having alignment marks, comprising the first measurement step of detecting the alignment mark on the substrate at a first magnification, and the second measurement step of detecting the alignment mark on the substrate at a second magnification higher than the first magnification, wherein in the first and second measurement steps, the alignment mark is detected using mark detection systems which share an objective unit and detect at respective magnifications by branching an optical path without switching the optical path.

According to the present invention, the foregoing object is attained by providing a substrate having an alignment mark on a scribe line, wherein the alignment mark comprises a first mark usable for global alignment measurement in a first direction which is a direction along which the scribe line extends, and a second mark usable for pre-alignment measurement in a second direction perpendicular to the first direction.

Also, according to another aspect of the present invention, an exposure apparatus and a device manufacturing method using the above alignment apparatus are provided.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 3 is a view showing a state in which a window for high-presition measurement is set for the alignment mark in FIG. 1A;

FIGS. 4A and 4B are views for explaining a barycenter calculation by the window for high-precision measurement;

FIG. 5 is a flow chart for explaining pre-alignment processing in the first embodiment;

FIGS. 6A and 6B are views showing another example of the alignment marks which can be shared by global alignment and pre-alignment, and arranged in a narrow scribe line;

FIG. 16 is a view showing the detailed flow of the wafer process shown in FIG. 15.

DETAILED DESCRIPTION OF THE PREFERRED EMBODIMENTS

Preferred embodiments of the present invention will be described in detail in accordance with the accompanying drawings.

(First Embodiment)

Figure 1A:
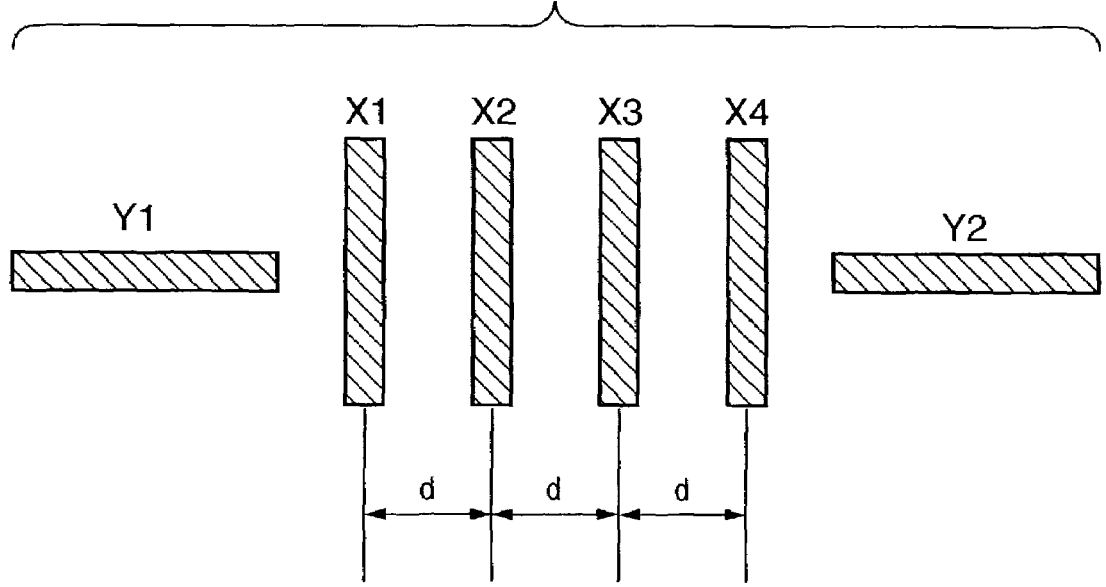
FIGS. 1A and 1B are views showing alignment marks in the first embodiment.
Figure 1B:
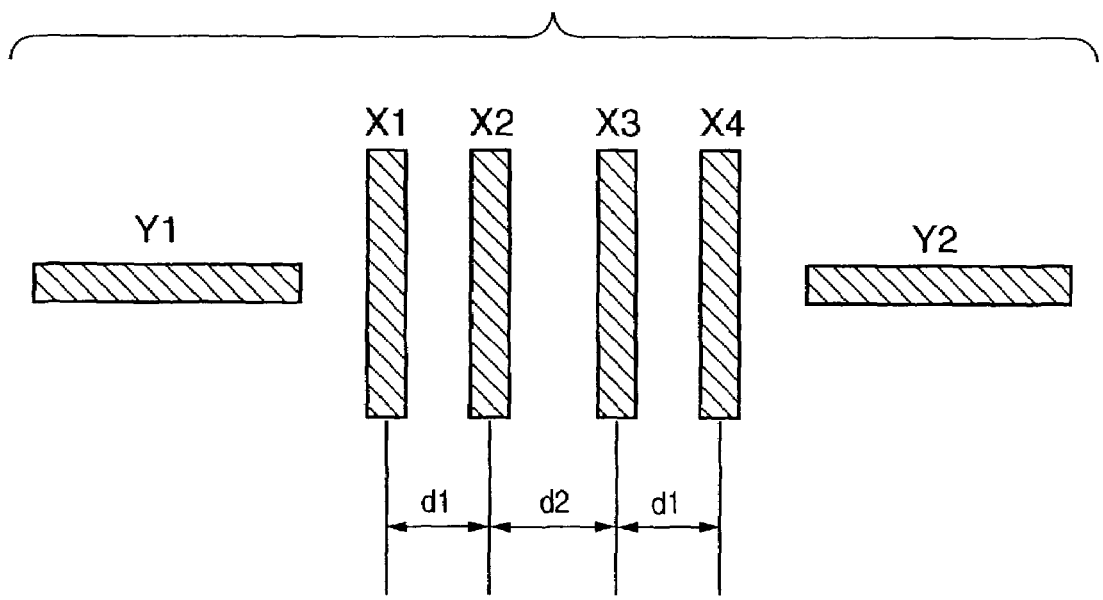

FIGS. 1A and 1B show alignment marks in the first embodiment. Each of the marks shown in FIGS. 1A and 1B can be arranged in a narrow scribe line. The marks can measure both X and Y directions at high precision, and be shared by global alignment and pre-alignment.

As shown in FIG. 1A, strip-shaped first measurement marks X1, X2, X3, and X4 are arranged in a direction along which each scribe line extends. The longitudinal direction of each of the marks is perpendicular to the direction of the scribe line. The first measurement marks X1 to X4 are rarely influenced by the scribe line because the marks are less affected by the scribe line in windows for high-precision detection (to be described later). Second measurement marks Y1 and Y2 are arranged outside the first measurement marks X1 to X4. The longitudinal direction of each of the marks is along the direction of the scribe line. The second measurement marks Y1 and Y2 are arranged at the center of the scribe line in order to minimize the influence of the scribe line. Note that, in FIG. 1A, the scribe line extends from left to right, and the direction of the scribe line coincides with the X direction. The first measurement marks (X1 to X4) and the second measurement marks (Y1, Y2) are called X measurement marks and Y measurement marks, respectively.

Figure 2:
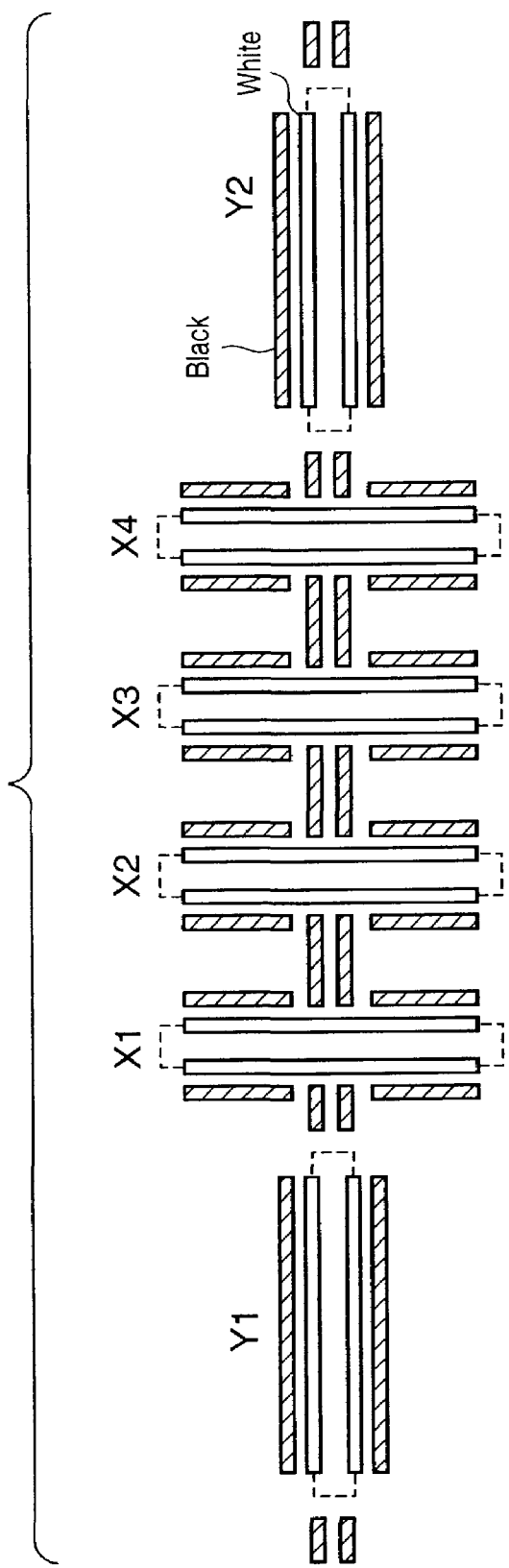
FIG. 2 is a view showing the example of a template used for detecting the alignment mark shown in FIG. 1A by image processing.

The position of the alignment mark shown in FIG. 1A is obtained by template matching done by image processing. FIG. 2 is a view showing the example of a template used for detecting the alignment mark in FIG. 1A by the image processing. In this case, the mark is illuminated with a dark field illumination system, a received image is binarized, and the mark position is searched by pattern matching. Because of the dark field illumination, the outline of the mark has high luminance (white), and a portion having no pattern has low luminance (black). Therefore, when the image is binarized, the outline becomes white (1), and the remaining portions become black (0).

As shown in FIG. 2, the template for template matching has a pattern in which the outline of the mark is white and the background of the mark is black. If the number of white patterns equals that of the black patterns, a high detection rate can be obtained. This is because when the template has many white patterns in binarizing the image including the mark, the white area is increased in the binarized image, thereby increasing the degree of correlation. On the other hand, when the template has many black patterns, the degree of correlation decreases. In this manner, regardless of the shape of the mark, the detection rate is influenced when the degree of correlation is changed by a reflectance. Note that an indeterminate portion (portion indeterminate for a white or black portion) and a portion useless as template information have no template information, and are excluded from the target of the matching processing.

Figure 14A:
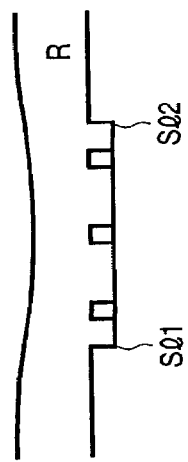
FIGS. 14A to 14D are views showing scribe lines, pre-alignment marks AP, and global alignment marks F.
Figure 14C:
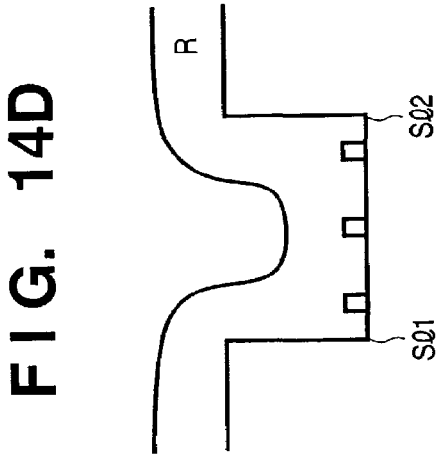
Figure 14B:
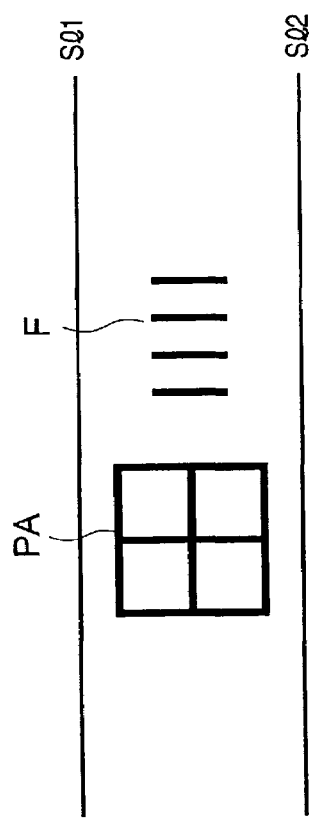
Figure 14D:
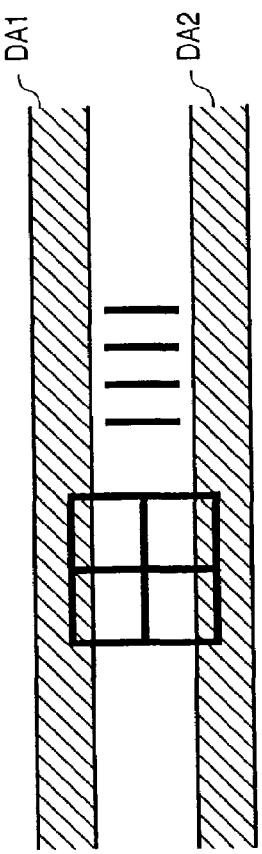

The feature of the template pattern shown in FIG. 2 is that there are four vertical lines, two horizontal lines, and five blank portions between the vertical lines and between the vertical and horizontal lines. Blank portions are also formed at the left and right of the end portions of the horizontal lines. The detection rate of pattern matching can be increased by arranging the features of the marks and a two-dimensional pattern on the template. When damage caused by the steps near the edges of the scribe line can be expected in the observable area, the template information is not included in this area. The template information is included only in an area with no damage. In an example in FIG. 2, each of the end portions of the X measurement marks X1, X2, X3, and X4 and the Y measurement marks Y1 and Y2 does not have any template information. The end portions of the X measurement marks are excluded from the target of the matching processing because the influence caused by the steps of the edges of the scribe line must be eliminated. This is because, for example, when areas DA1 and DA2 in FIG. 14C are increased upon arranging the marks shown in FIG. 1A in the scribe line as shown in FIG. 14C, the end portions of the marks X1, X2, X3, and X4 are readily influenced.

In pattern matching by the template as described above, the mark positions can be detected in the precision of one or two pixels. However, in pre-alignment measurement for implementing global alignment measurement, the mark positions must be obtained at higher resolving power, i.e., in the precision of one pixel or less. A method of obtaining the mark positions in the precision of one pixel or less will be described below.

When the mark positions are determined in precision of one or two pixels by pattern matching described above, on the basis of the determined positions, windows for high-precision measurement are set in the portions determined by the set values of the marks. FIG. 3 is a view showing a state in which the windows for high-precision measurement are arranged for the alignment mark in FIG. 1A. Then, the information of the position is compressed to a one-dimensional signal by projection processing in a mark non-measuring direction in each of the windows WX1, WX2, WX3, WX4, WY1, and WY2. Processing represented by a barycenter calculation is performed for the compressed signal to calculate the positions of the measurement marks in precision of one pixel or less. For example, as shown in FIG. 4A, the window WX1 for high-precision measurement is set for the X measurement mark X1. Then, as shown in FIG. 4B, the X measurement mark X1 is projected in the non-measuring direction (the Y direction) in this window WX1, thereby obtaining a barycenter X1G.

In this manner, the average of the positions of all the X measurement marks in the X direction and the average of the positions of all the Y measurement marks in the Y direction are calculated in one alignment mark. The average values are used as measurement results obtained by pre-alignment performed for the alignment marks in the X and Y coordinates. As described above, the marks are detected by template matching at a low magnification. The marks are detected by a barycenter calculation after the windows are set, projected, and integrated at a high magnification.

The above pre-alignment processing will be further described with reference to FIG. 5. Note that an exposure apparatus for performing pre-alignment processing in this embodiment is the same as the exposure apparatus shown in FIG. 13. FIG. 5 is a flow chart for explaining the pre-alignment processing in the first embodiment. The flow chart in FIG. 5 describes the pre-alignment processing performed by the scope SC after the wafer having undergone mechanical alignment by the mechanical alignment apparatus MA is set on the chuck, and the chuck with the wafer is set on the stage STG.

First, in step S11, the position of the alignment mark in FIG. 1A is measured by using the template shown in FIG. 2. In step S12, the position of the wafer is corrected on the basis of the measurement result. In step S13, the windows for high-precision measurement as shown in FIG. 3A are set. In step S14, the marks are projected in the set windows for high-precision measurement, and the barycenter positions are calculated to determine the position of the alignment mark (FIG. 3B). With the processing described above, the pre-alignment measurement using the mark in FIG. 1A can be performed, and the measurement result is output in step S15. For example, the global alignment measurement can be performed by using this measurement result. Note that the entire procedure of the alignment processing including the global alignment measurement will be described in detail in the third and fourth embodiments.

Note that the alignment marks in FIGS. 1A and 1B show the marks which can be arranged in horizontal scribe lines (the scribe lines arranged in the direction which coincides with the X direction). If the marks are rotated through 90°, the alignment marks show the marks which can be arranged in vertical scribe lines (the scribe lines arranged in the direction which coincides with the Y direction). The marks, template, and processes are the same as described above. That is, when the marks are arranged in the vertical scribe lines, the measurement marks X1 to X4 serve as the Y measurement marks, and the measurement marks Y1 and Y2 serve as the X measurement marks.

Note that the alignment marks in FIGS. 1A and 1B show the marks which can be arranged in horizontal scribe lines (the scribe lines arranged in the direction which coincides with the X direction). If the marks are rotated through 90°, the alignment marks show the marks which can be arranged in vertical scribe lines (the scribe lines arranged in the direction which coincides with the Y direction). The marks, template, and processes are same as described above. That is, when the marks are arranged in the vertical scribe lines, the measurement marks X1 to X4 serve as the Y measurement marks, and the measurement marks Y1 and Y2 serve as the X measurement marks.

In the first embodiment, the pattern obtained by the dark field illumination is binarized, the mark positions are detected by pattern matching, and the mark positions are obtained by a barycenter calculation with a high resolution. However, as long as the marks can be identified, the bright field illumination or other illumination can be used. When the bright field illumination is used, the outline of the pattern may be black. Hence, white and black portions of the template shown in FIG. 2 may be inverted.

A method of obtaining mark positions is not limited to the binarization. For example, various methods, e.g., a method of extracting the outline of the marks and performing pattern matching can be applied.

(Second Embodiment)

FIGS. 6A and 6B show another example of alignment marks each of which can be shared by global alignment and pre-alignment, and arranged in a narrow scribe line.

The alignment mark shown in FIG. 6A is so designed as to reduce the influence of a resist applied onto a mark on detection. Two fence marks (401 and 402) are arranged outside four center X marks. A plurality of marks including these fence marks smooth nonuniformity of a resist portion to reduce the resist coating nonuniformity. In FIG. 6B, the fence marks 401 and 402 which reduce the influence of resist coating are arranged. In addition, the interval between the four center measurement marks is changed to decrease the erroneous detection frequency in pre-alignment, similar to the alignment mark of FIG. 1B.

Note that the procedure of pre-alignment measurement for the alignment marks shown in FIGS. 6A and 6B is the same as that described in the first embodiment (FIG. 5).

As described above, the following effects can be obtained by the alignment marks in the first and second embodiments. That is, 1. The alignment marks which can be arranged in the scribe lines and measure the X and Y coordinates at high precision can be obtained.
2. The global alignment mark (X measurement marks in FIGS. 1A and 1B and FIGS. 6A and 6B) in which an auxiliary pattern (Y measurement marks in FIGS. 1A and 1B and FIGS. 6A and 6B) is added is employed. Hence, the alignment marks which can be shared by pre-alignment and global alignment can be provided.
3. Since the auxiliary pattern is arranged at the center of the scribe line, the pattern is not affected by the edges of the scribe line in the measurement direction.
4. The mark for measuring both pre-alignment and global alignment is used. Hence, the size of the pre-alignment mark is reduced, and the damage, e.g., narrowed observable area can be prevented. Additionally, a mark dedicated area can be narrowed.
5. In mark tuning such as CMP, both pre-alignment and global alignment need not be tuned, thereby increasing the yield and productivity.

(Third Embodiment)

In the third embodiment, alignment processing including global alignment will be described by using the alignment marks described in the first and second embodiments and pre-alignment measurement thereof. In global alignment using the alignment marks described in FIGS. 1A and 1B and FIGS. 6A and 6B, the X measurement marks X1 to X4 are observed by the high-magnification scope, and the positions of the X alignment marks are detected at higher resolving power than in pre-alignment by the method described in FIGS. 3 and 4. A procedure will be described with reference to the alignment mark in FIG. 6A, but alignment can be performed in the same procedure using the alignment marks in FIG. 6B and FIGS. 1A and 1B.

Figure 7:
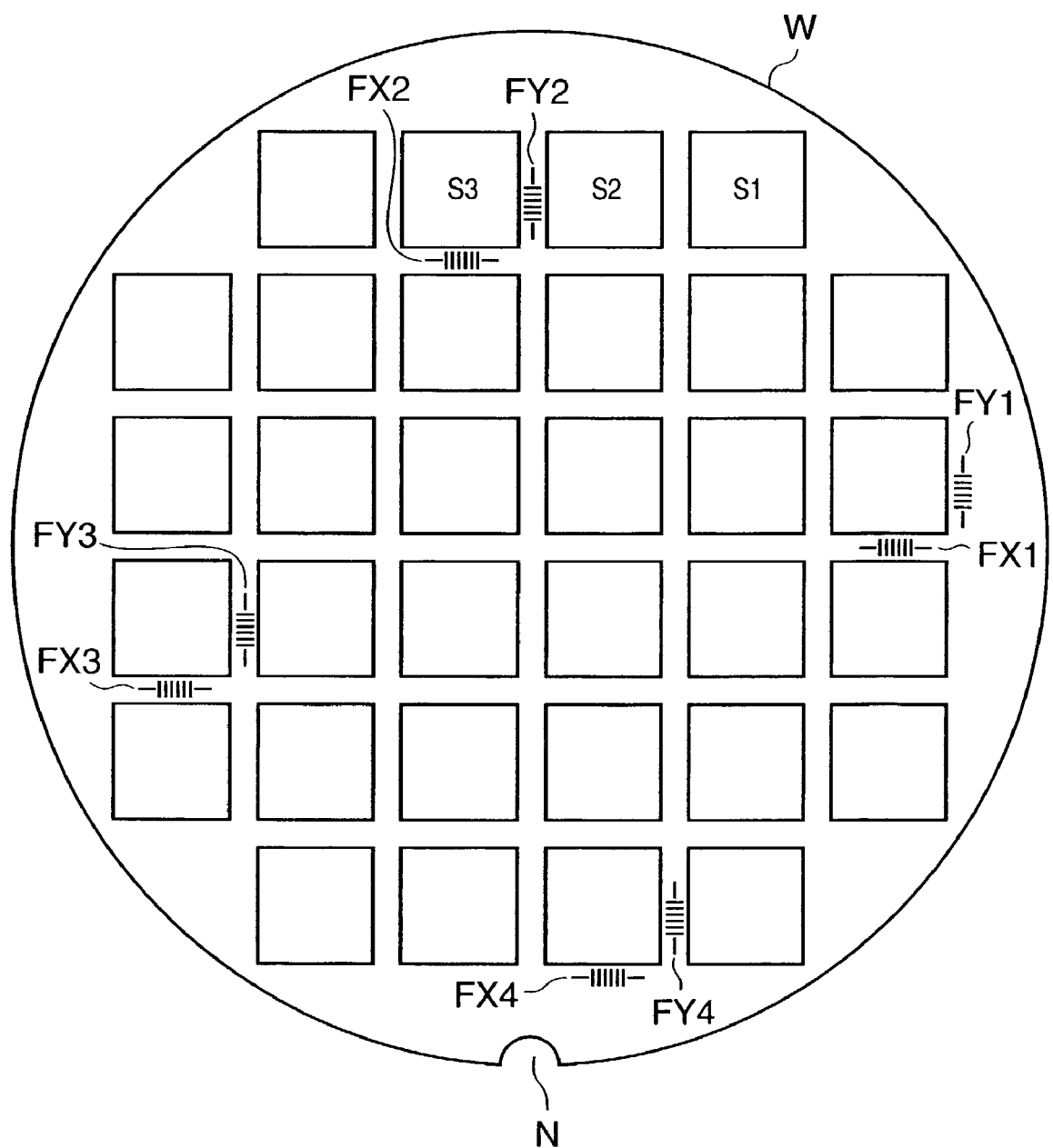
FIG. 7 is a view showing a state in which the alignment marks in FIG. 6A are arranged in vertical and horizontal scribe lines on the wafer.

FIG. 7 shows a state in which the alignment marks shown in FIG. 6A are arranged in vertical and horizontal scribe lines on the wafer. The alignment marks shown in FIG. 6A are arranged in the horizontal scribe lines (FX1 to FX4), and used for the X measurement in global alignment. The marks shown in FIG. 6A rotated through 90° are arranged in the vertical scribe lines (FY1 to FY4), and used for the Y measurement in global alignment.

Figure 11:
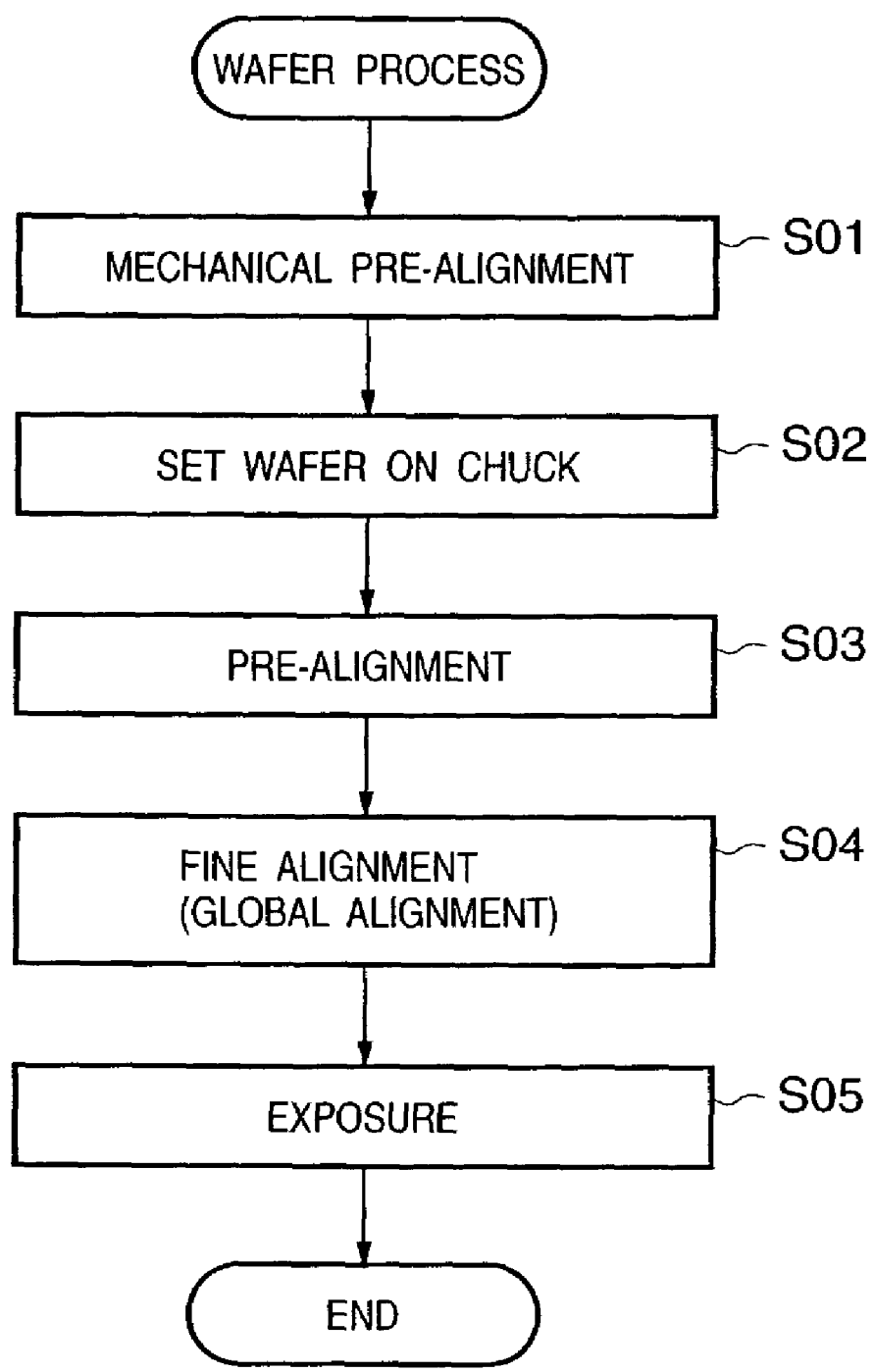
FIG. 11 is a flow chart for explaining the procedure of general alignment processing.
Figure 12:
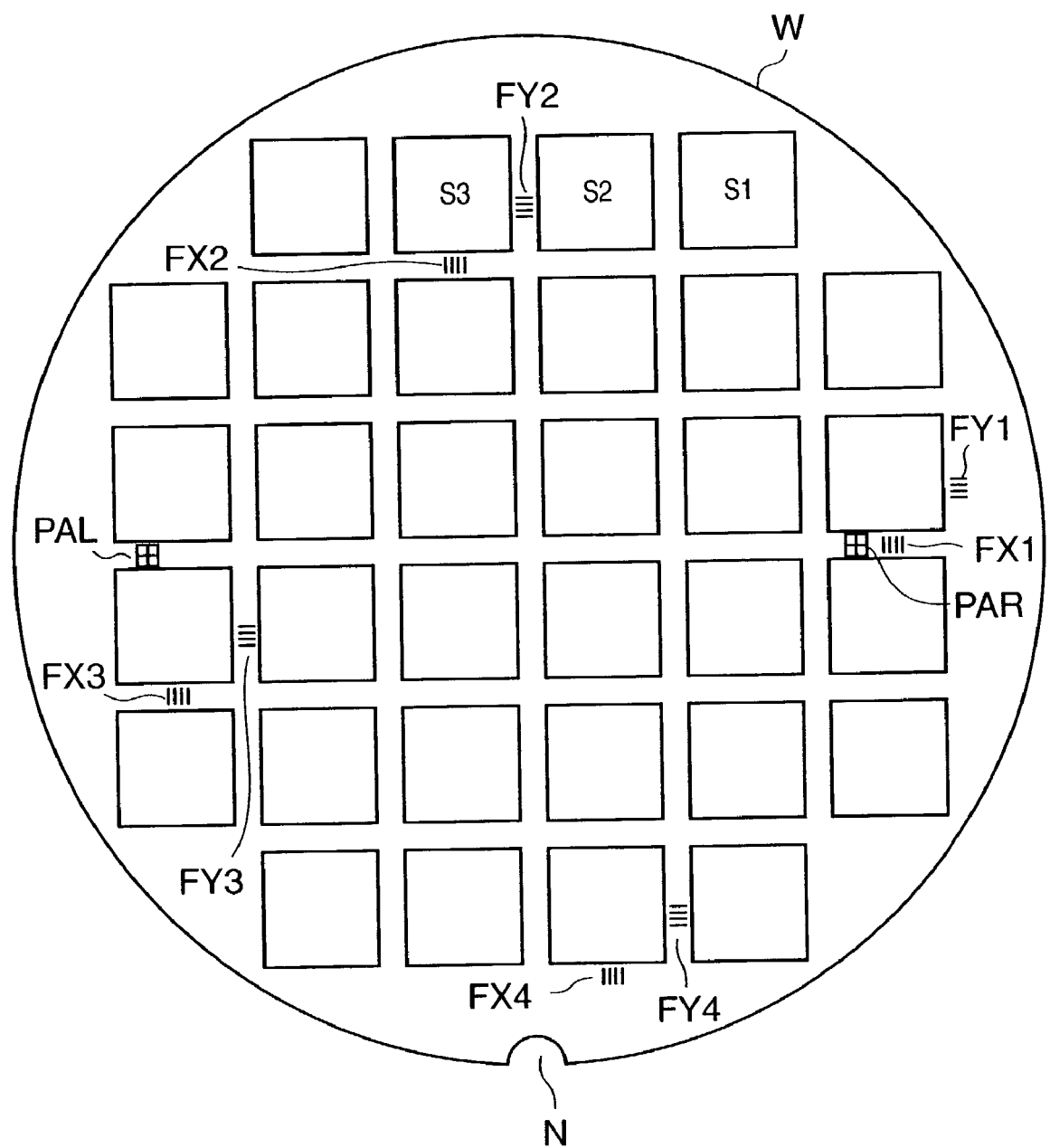
FIG. 12 is a view showing alignment marks on a general wafer.
Figure 13:
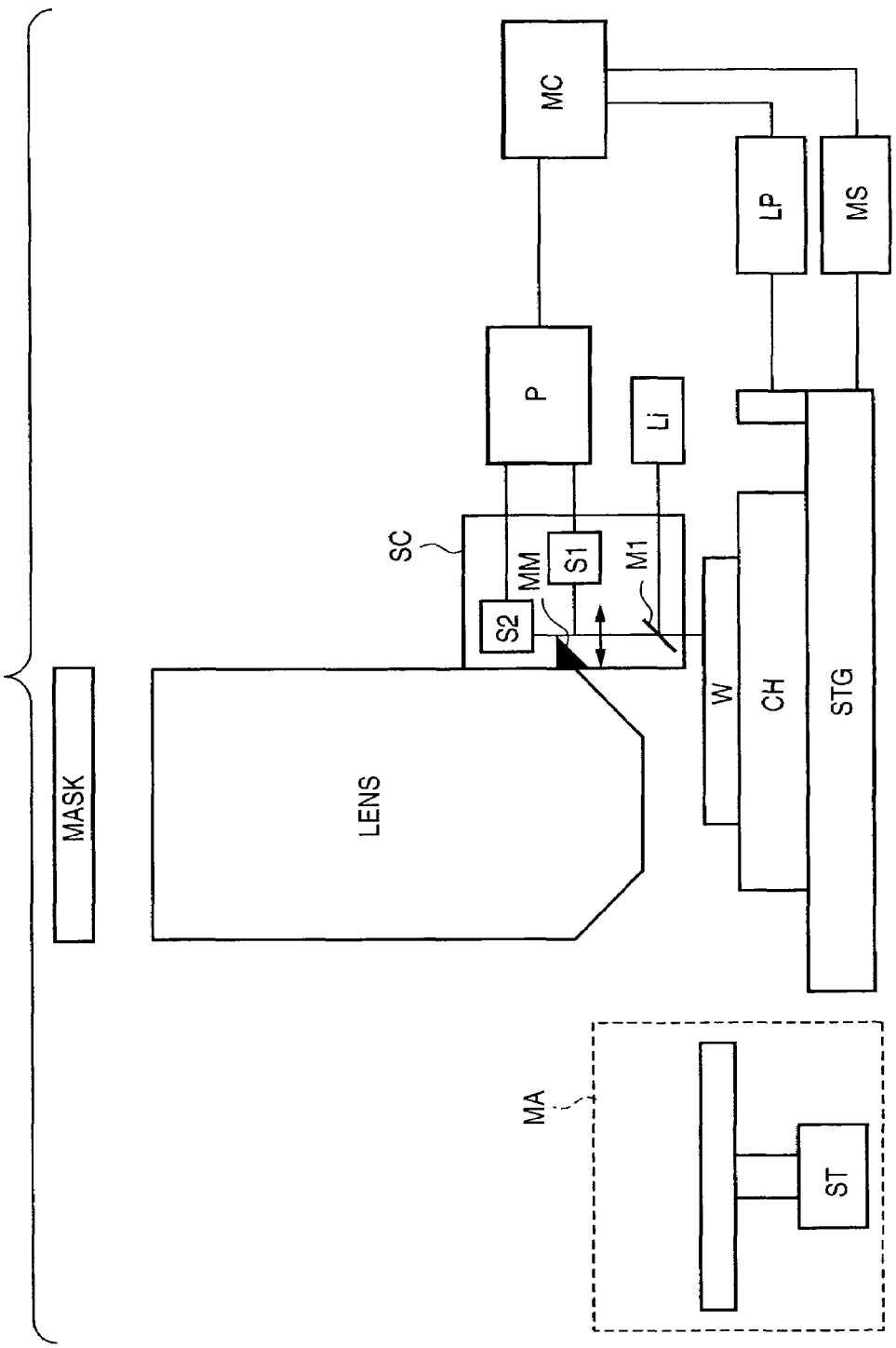
FIG. 13 is a view for explaining the alignment mechanism of a general exposure apparatus.

With reference to FIGS. 7, 11, and 13, alignment processing by using the marks which can be shared by global alignment and pre-alignment will be described below. If a wafer W is supplied to a semiconductor manufacturing apparatus, a mechanical alignment apparatus MA mechanically aligns the wafer W by using the periphery of the wafer and a notch N to determine the rough position of the wafer W (step S01). Then, the wafer is set on a chuck CH by a wafer supply apparatus (not shown) (step S02), supplied to a stage STG, and pre-aligned (step S03). In pre-alignment, a mirror MM moves to the right in FIG. 13. The X and Y positions of the alignment marks FX1 and FX3 or FY1 and FY3 shown in FIG. 7 are sensed using the low-magnification sensor S1 of a scope SC to detect the center of the wafer. At this time, the pre-alignment measurement is performed in the procedure shown in step S11 in FIG. 5. The pre-alignment precision is higher as the interval between two marks to be measured is larger.

On the basis of the center of the wafer obtained by the above pre-alignment, global alignment is performed to accurately obtain the wafer position and exposure shot position (step S04). Then, exposure starts (step S05). In global alignment, measurement is performed in the procedure shown in steps S13 to S15 in FIG. 5. Note that global alignment is performed by moving the mirror MM in the scope SC to the left in FIG. 13, and using a high-magnification sensor S2. In global alignment, each of the X measurement marks in the plurality of alignment marks FX1 to FX4 and each of the Y measurement marks in the alignment marks FY1 to FY4 on the wafer are measured. In this maimer, X- and Y-direction shifts of the wafer W, the rotational component, and the magnification component of the shot array are obtained.

Note that in the above alignment processing, pre-alignment is performed using FX1 and FX3 (or FY1 and FY3), and after that, global alignment is performed using FX1 to FX4, and FY1 to FY4. However, the global alignment measurement may be performed for the marks immediately after each of pre-alignment measurement for FX1 and FX3 (or FY1 and FY3). In this manner, the moving amount of the stage STG for performing the pre-alignment measurement and the global alignment measurement for FX1 and FX3 (or FY1 and FY3) can be reduced.

In global alignment using the high-magnification sensor for detecting the positions of the alignment marks, the erroneous detection frequency becomes low with a change in measurement mark interval even at one portion in detecting a mark position (FIGS. 1B and 6B) as compared with the same interval between the X measurement marks (FIGS. 1A and 6A). The reason for this is as follows. When four mark positions on the mark shown in FIG. 6B are accurately obtained, the interval between marks may be erroneously detected as a mark. This occurs when a pseudo mark appears between marks due to generation of interference fringes. By changing even one interval between measurement marks, the mark interval is compared with the mark design value after detection of four mark positions, and whether the mark is erroneously detected can be checked. A retry function of, if erroneous detection is determined, changing the target processing position to a position shifted by half the pitch and calculating the position again can be added.

(Fourth Embodiment)

In the above third embodiment, when the positions of the alignment marks shown in FIGS. 1A and 1B and FIGS. 6A and 6B are to be detected, the pre-alignment measurement is performed by the low-magnification scope SC, and then the global alignment measurement is performed by switching the scope SC to a high magnification. In the fourth embodiment, the scope can simultaneously observe the marks at low and high magnifications, a mirror need not be switched, and a wafer alignment time can be further reduced.

Figure 8:
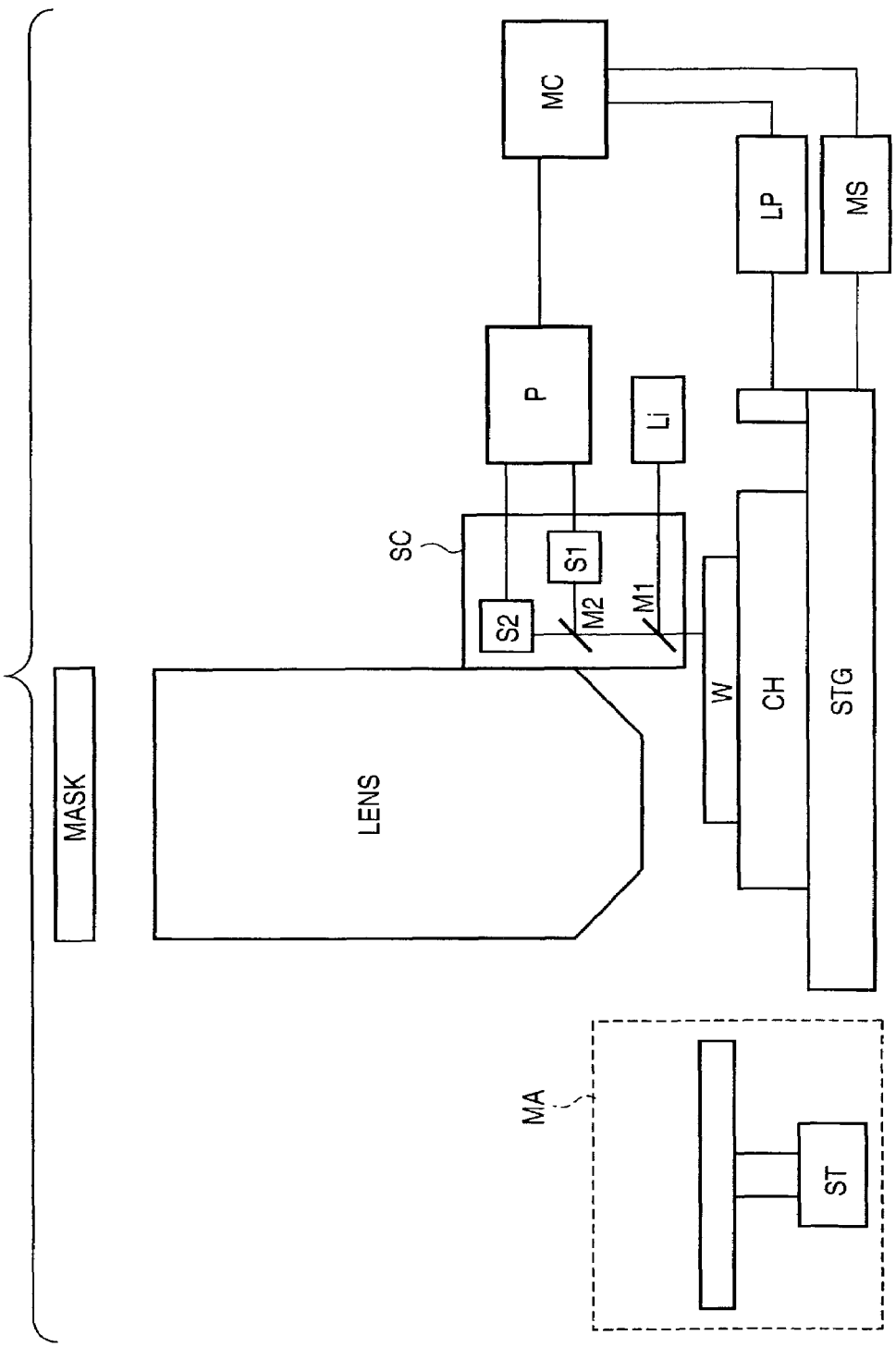
FIG. 8 is a view showing the arrangement of an exposure apparatus in the fourth embodiment.

FIG. 8 shows the arrangement of an exposure apparatus in the fourth embodiment. In this arrangement, the scope SC for wafer alignment shown in FIG. 8 can simultaneously observe low- and high-magnification images by sharing an objective unit. Hence, the mark positions can be detected without switching, e.g., moving a mirror MM. Illumination light is guided from an alignment mark illumination light source Li into the scope SC, and illuminates the marks on the wafer through a half-mirror M1. For example, the light illuminates the mark FX1 in FIG. 7. Light reflected by a wafer W reaches a high-magnification sensor 32 and low-magnification sensor S1 through the half-mirror M1 and a half-mirror M2. Image signals sensed by the sensors S1 and S2 are processed by an alignment mark measurement processing apparatus P to measure the positions of the alignment marks.

A main controller MC controls a driving unit MS which drives a stage STG on the basis of a measurement result from the alignment mark measurement processing apparatus P and a signal from a stage position sensor LP. The main controller MC implements the control of alignment and exposure to be described below.

Figure 9:
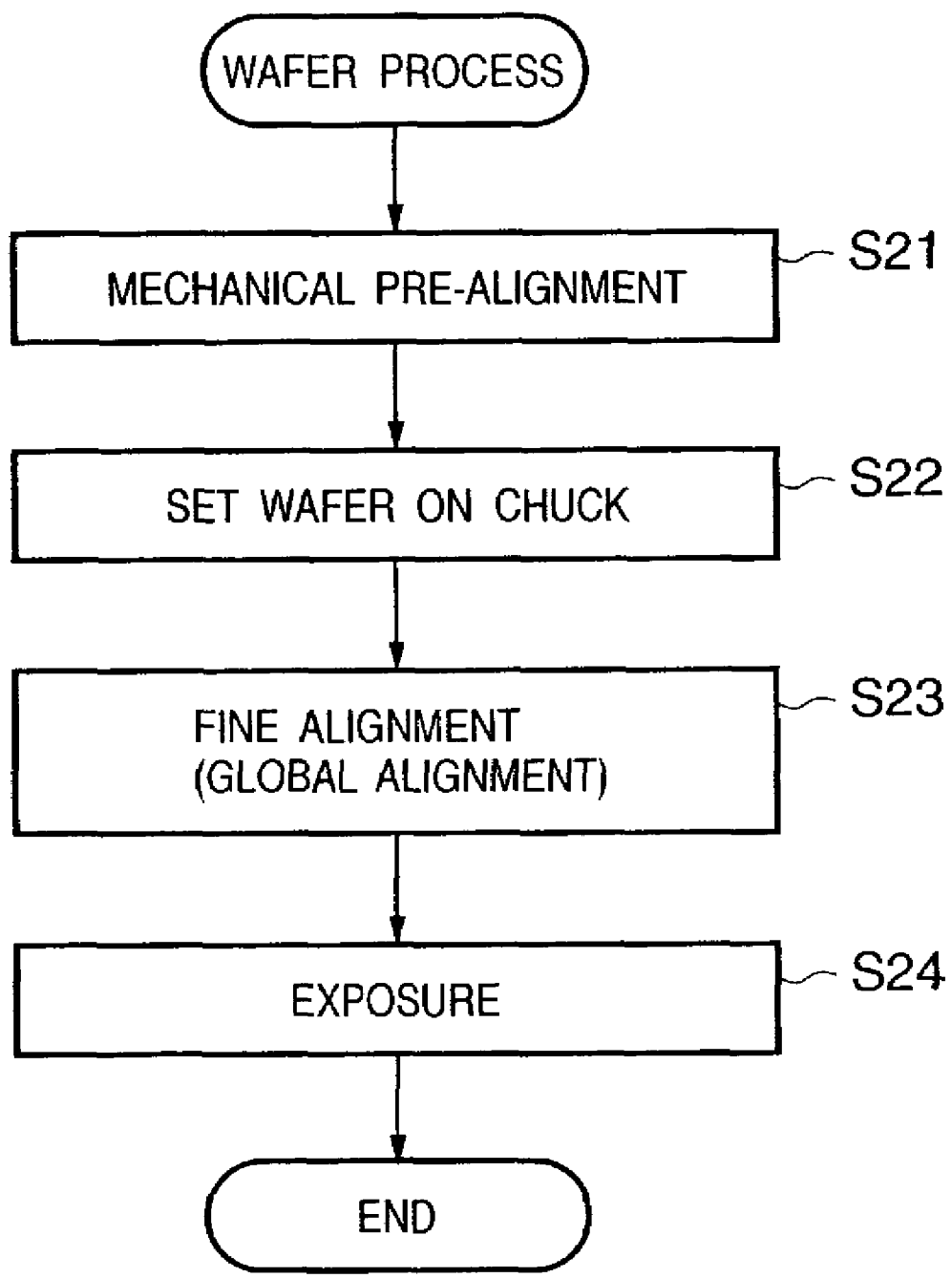
FIG. 9 is a flow chart for explaining alignment processing in the fourth embodiment.
Figure 10:
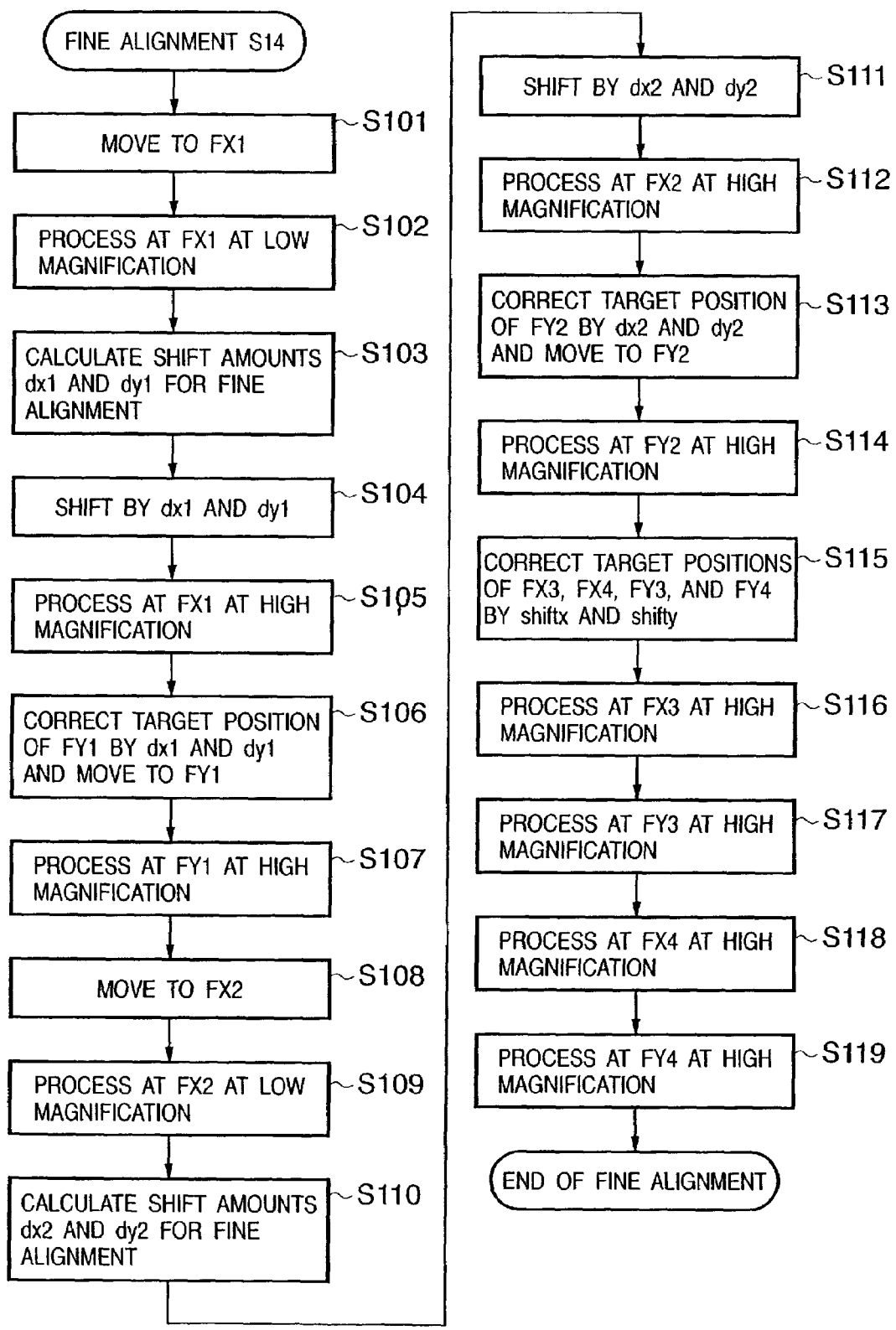
FIG. 10 is a flow chart for explaining the procedure of alignment mark measurement in the fourth embodiment.

Referring to FIGS. 9 and 10, the procedure of detecting the alignment marks in the fourth embodiment will be described. After mechanical alignment performed by a mechanical alignment apparatus MA (step S21) ends, global alignment in the procedure shown in FIG. 10 is performed (step S23) for the wafer W placed on a chuck CH (step S22). In this manner, when the wafer has been positioned, the exposure starts to expose a pattern on a mask (MASK) to the wafer W by a projection optical system LENS (step S24).

In global alignment of this embodiment, the wafer moves to the mark position FX1 (step S101), and the scope SC simultaneously observes the marks by the low- and high-magnification sensors. That is, first, the positions of the alignment marks are obtained by sensing the mark FX1 at a low magnification (step S102). By using this result, a shift dx1 in the X direction and a shift dy1 in the Y direction from the target mark position are calculated (step S103). Note that, in low-magnification measurement processing such as step S102, the procedure of the pre-alignment measurement described in step S11 in FIG. 5 is used. The position of the wafer W is shifted by the calculated shifts dx1 and dy1 so that the wafer W falls within the field of view of the high-magnification sensor (step S104). In this state, since the wafer falls within the field of view of the high-magnification sensor, the mark FX1 is measured at a high magnification (steps S13 and S14 in FIG. 5) using a signal from the senor S2 (step S105).

Next, when the scope is to move to the mark position FY1, the target mark position FY1 is corrected by the shifts dx1 and dy1 calculated in step S103, then moves to the mark position FY1 (step S106). Since the distance between the marks FX1 and FY1 is small, the mark FY1 can fall within the high-magnification field of view while rarely receiving the influence of a θ component obtained upon placing the wafer on the chuck. Therefore, the position measurement processing is immediately performed for the mark FY1 by the high-magnification sensor S2 (step S107), and then the scope moves to the position of the next mark FX2.

The positions of the alignment marks FX2 and FY2 are calculated by the same processes as those in steps S101 to S107 (steps S108 to S114). After two pairs of mark positions ((FX1, FY1) and (FX2, FY2)) are calculated, the θ component and the shift, i.e., shift X and shift Y of the center upon setting the wafer on the chuck can be determined (step S115). The target positions of the alignment marks FX3, FX4, FY3, and FY4 which have not undergone global alignment measurement are corrected by θ, shift X, and shift Y. That is, the same processes are sequentially executed for the alignment marks FX3, FY3, FX4, and FY4 by the high-magnification detection system. These alignment marks need not be observed at a low magnification because their target positions are accurately corrected (steps S116 to S119).

This method can process the wafer without moving the scope SC to PAL and PAR, unlike the prior art which moves the scope SC to the positions PAL and PAR to obtain the mark positions. In the measurement of the marks FX1 and FX2, the pre-alignment measurement and the global alignment measurement can be performed without moving the scope SC. This method can shorten the stage moving distance (times), and the stage moving time in alignment processing.

Whether the alignment marks have fallen within the field of view of the high-magnification sensor is determined on the basis of the shift amount (e.g., dx1, dy1, dx2, and dy2) obtained as a result of the low-magnification measurement processing. When the marks fall within the field of view of the high-magnification sensor, the movement by the calculated shift amount can be omitted. In this manner, an increase in processing speed can be further expected.

The arrangement shown in FIG. 8 has been described by exemplifying an off-axis alignment semiconductor manufacturing apparatus. This arrangement can be applied to any type such as the TTL alignment type in which the wafer mark is observed through an exposure projection optical system or the TTR alignment type in which a wafer mark is observed through a reticle (mask) as far as a scope capable of observing a mark simultaneously at low and high magnifications is used and the mark can be shared by pre-alignment and global alignment. The above processing can be implemented by a scope whose magnification is changed by moving the mirror as shown in FIG. 13.

Note that, in sequential image sensing by the low- and high-magnification sensors, the amount of illumination light may be changed (by ND filter switching and the like) in synchronism with an image sensing sequence so that illumination properly light-controlled is performed on a sensor. In this case, e.g., during image sensing at a low magnification, or before this sensing step, illumination information of the wafer may be obtained by sensing image at a low magnification, and light control using the high-magnification sensor may be performed on the basis of the information.

Note that after the sequential control for predetermined marks or a predetermined wafer is performed on the basis of the above flow of alignment, at least a part of the sequence for next marks or wafer may be omitted. For example, in processing shown in the flow chart in FIG. 10, when a plurality of marks are to be detected in global alignment, only the first and second marks are sensed at the low-magnification, and the third and subsequent marks are directly measured at a high magnification. The present invention is not limited to this. The θ component may be added to the target position data of the measurement marks to omit θ adjustment processing on the wafer. Alternatively, the second and subsequent wafers may be directly measured at a high magnification by using the low-magnification sensing information of the first wafer.

With regard to an image sensing system, NAs (numerical appartures) may be made different by the optical system in the optical path after separating by the half-mirror, and the depth of focus of low-magnification image sensing may be larger than that of high-magnification image sensing. The wavelengths of the high- and low-magnification illumination light beams may be made different depending on the sensors.

For shortening a time, detection of the marks in the low-magnification image sensing, or focusing operation for the low-magnification image sensing may be started during wafer movement by the stage to the position for sensing image at a low magnification.

The detection mode of a mark detection system at a high magnification may be different from that at a low magnification. For example, the scheme for image processing can be changed in accordance with the magnification. Low-magnification alignment can be performed under the bright field illumination, and high-magnification alignment can be preformed under the dark field illumination. The mark can be detected by the reflected light or scattered light in beam scanning in place of image sensing.

As described above, according to the above embodiments, pre-alignment and global alignment can be simultaneously performed. Hence, the stage moving amount for pre-alignment can be reduced, and alignment can be performed within a short time.

As described above, according to each embodiment described above, the alignment marks used for both pre-alignment and global alignment are provided. Hence, the pre-alignment marks become small to cope with damage such as a narrow observable area. Additionally, the mark dedicated area can be made narrow. In mark tuning processing such as CMP, both pre-alignment and global alignment need not be tuned. As a result, the yield and productivity increase.

Additionally, since the alignment marks are simultaneously observed at the low and high magnifications, the conventional pre-alignment processing is performed within a short time, and the number of wafers to be processed per unit time is increased.

Additionally, according to the embodiments, the marks become as small as the width of the scribe lines, and the marks maintain a size large enough to be searched at a low magnification in the longitudinal direction of the scribe line. Hence, the marks which can cope with the decrease in width of the scribe line, and can be shared by global alignment and pre-alignment are proposed. The marks cannot only cope with the decrease in width of the scribe line, but also decrease the load of tuning the marks by sharing between pre-alignment and fine alignment. The detection error can be effectively prevented by different intervals between the marks and template design in pre-alignment. In the embodiment, since the number of times of stage movement for the pre-alignment processing and the moving amount are reduced, the throughput is increased. The marks of the present invention can effectively increase the yield by improving the quality of the semiconductor fabrication, and also increase the productivity.

Figure 15:
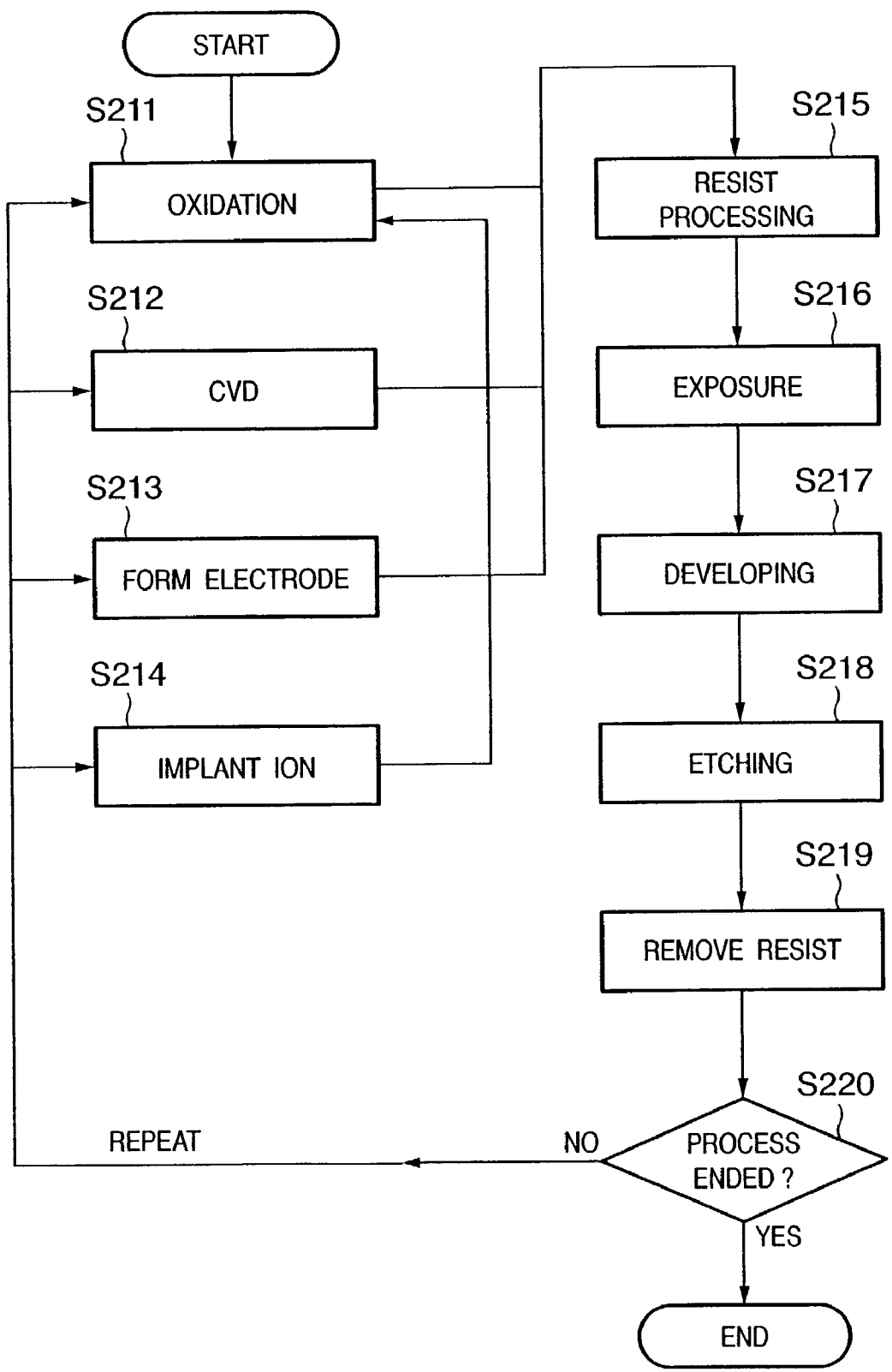
FIG. 15 is a view showing the flow of the entire manufacturing process of a semiconductor device.

Semiconductor device manufacturing processing using the above-described exposure apparatus will be explained. FIG. 15 shows the flow of the whole manufacturing processing of the semiconductor device. In step S201 (circuit design), a semiconductor device circuit is designed. In step S202 (mask formation), a mask having the designed circuit pattern is formed. In step S203 (wafer manufacture), a wafer is manufactured by a material such as silicon.

In step S204 (wafer processing), called a pre-process, an actual circuit is formed on the wafer by lithography using a prepared mask and the wafer. Step S205 (assembly)1 called post-processing, is the step of forming a semiconductor chip using the wafer manufactured in step S204, and includes assembly processing (dicing and bonding) and packaging processing (chip encapsulation). In step S206 (inspection), inspections such as the operation confirmation test and durability test of the semiconductor device manufactured in step S205 are conducted. After these steps, the semiconductor device is completed and shipped (step S207).

For example, the pre-processing and post-processing are performed in separate dedicated factories, and maintenance is done for each of the factories by the above-described remote maintenance system. Information for production management and apparatus maintenance is communicated between the pre-processing factory and the post-processing factory via the Internet or dedicated network.

FIG. 16 shows the detailed flow of the wafer processing. In step S211 (oxidation), the wafer surface is oxidized. In step S212 (CVD), an insulating film is formed on the wafer surface. In step S213 (electrode formation), an electrode is formed on the wafer by vapor deposition. In step S214 (ion implantation), ions are implanted in the wafer. In step S215 (resist processing), a photosensitive agent is applied to the wafer. In step S216 (exposure), the X-ray exposure apparatus described above exposes the wafer to the circuit pattern of a mask. In step S217 (developing), the exposed wafer is developed. In step S218 (etching), the resist is etched except for the developed resist image. In step S219 (resist removal), an unnecessary resist after etching is removed.

These steps are repeated to form multiple circuit patterns on the wafer.

As has been described above, the present invention can provide alignment marks which can be shared by global alignment and pre-alignment, and applied to narrow scribe lines, and an alignment apparatus and method using the marks.

According to the present invention, global alignment and pre-alignment are performed without switching the optical path by sharing an objective unit, thereby reducing an alignment time.

As many apparently widely different embodiments of the present invention can be made without departing from the spirit and scope thereof, it is to be understood that the invention is not limited to the specific embodiments thereof except as defined in the claims.

What is claimed is:

1. An alignment apparatus which positions a substrate having an alignment mark which includes a first mark usable for global alignment measurement in a first direction, and a second mark usable for pre-alignment measurement in a second direction, said apparatus comprising:
   first measurement means for performing pre-alignment measurement in the first and second directions of the alignment mark by using the first mark and the second mark;
   moving means for moving to correct a position of the substrate on the basis of a result of the pre-alignment measurement; and
   second measurement means for performing global alignment measurement by the first mark in the first direction of the alignment mark by using the first mark after moving the substrate.

2. The apparatus according to claim 1, wherein
   said first measurement means senses the alignment mark at a first magnification, and performs the pre-alignment measurement by image processing for the first and second marks of the sensed alignment mark, and
   said second measurement means senses the alignment mark at a second magnification higher than the first magnification, and performs the global alignment measurement by image processing for the first marks of the sensed alignment mark.

3. The apparatus according to claim 1, wherein
   said first and second measurement means are low- and high-magnification mark detection systems which share an objective unit and have variable magnification systems and dedicated detectors, and the low- and high-magnification mark detection systems can simultaneously measure the alignment mark on the substrate.

4. The apparatus according to claim 3, further comprising illumination means for providing illumination individually light-controlled for the detectors of said first and second measurement means.

5. The apparatus according to claim 4, wherein
   said illumination means obtains light control information for detecting marks at the high magnification of said second measurement means during detection of the marks at the low magnification of said first measurement means, or in the step before the detection.

6. The apparatus according to claim 4, wherein
   both the low- and high-magnification mark detection systems have illumination light wavelengths different from each other.

7. The apparatus according to claim 3, wherein
   numerical apertures (NAs) of both the low- and high-magnification mark detection systems are different from each other.

8. The apparatus according to claim 3, wherein
   a focus depth of the low-magnification mark detection system is larger than that of the high-magnification mark detection system.

9. The apparatus according to claim 3, wherein
   while moving the exposure substrate by the stage to the position for detecting the marks by the low-magnification mark detection system, detection or focusing of the low-magnification mark detection system starts.

10. The apparatus according to claim 3, wherein
    a detection mode of the low-magnification mark detection system is different from a detection mode of the high-magnification mark detection system.

11. The apparatus according to claim 1, wherein
    the alignment mark formed on the substrate comprises a plurality of alignment marks, and the apparatus comprises control means for performing measurement for the plurality of alignment marks by said first and second measurement means, and
    said control means performs measurement for a predetermined alignment mark by said first and second measurement means, and performs measurement for remaining alignment marks by only said second measurement means.

12. The apparatus according to claim 11, wherein
    said control means performs:
    (i) a first process for performing measurement for a first alignment mark by said first and second measurement means, and performing measurement for the alignment marks which are arranged within a predetermined distance from the first alignment mark by only said second measurement means on the basis of the measurement result;
    (ii) a second process for performing measurement for a second alignment mark which falls outside the predetermined distance by said first and second measurement means, and performing measurement for the alignment marks which fall within a predetermined distance from the second alignment mark by only said second measurement means on the basis of the measurement result; and
    (iii) a third process for correcting the position of the remaining alignment marks on the basis of the measurement result obtained by the first and second processes, and performing measurement by only said second measurement means.

13. The apparatus according to claim 1, wherein
    a predetermined substrate is positioned by said first and second measurement means, and then a next substrate is positioned by only said second measurement means.

14. An alignment method of positioning a substrate having an alignment mark including a first mark usable for global alignment measurement in a first direction and a second mark usable for pre-alignment measurement in a second direction, said method comprising:
    a first measurement step of performing the pre-alignment measurement in the first and second directions of the alignment mark by using the first and second marks;
    a moving step of moving the substrate to correct the position on the basis of a result of the pre-alignment measurement; and
    a second measurement step of performing the global alignment measurement in the first direction of the alignment mark by using the first mark after the moving step.

* * * * *